(12) United States Patent
Choi et al.

(10) Patent No.: US 6,989,338 B2
(45) Date of Patent: Jan. 24, 2006

(54) METHOD FOR FORMING A MULTI-LAYERED STRUCTURE OF A SEMICONDUCTOR DEVICE AND METHODS FOR FORMING A CAPACITOR AND A GATE INSULATION LAYER USING THE MULTI-LAYERED STRUCTURE

(75) Inventors: Han-Mei Choi, Seoul (KR); Young-Wook Park, Gyeonggi-do (KR); Eun-Taek Yim, Gyeonggi-do (KR); Dong-Jo Kang, Gyeonggi-do (KR); Kyoung-Seok Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 153 days.

(21) Appl. No.: 10/737,394

(22) Filed: Dec. 15, 2003

(65) Prior Publication Data

US 2004/0209430 A1 Oct. 21, 2004

(30) Foreign Application Priority Data

Jan. 2, 2003 (KR) .............................. 10-2003-0000030

(51) Int. Cl.
*H01L 21/26* (2006.01)

(52) U.S. Cl. ...................................... 438/795; 118/725
(58) Field of Classification Search ................. 438/795; 118/725
See application file for complete search history.

(56) References Cited

U.S. PATENT DOCUMENTS

| | | | | |
|---|---|---|---|---|
| 6,057,038 A | * | 5/2000 | Terashita et al. ............ | 428/447 |
| 6,066,525 A | | 5/2000 | Liu et al. | |
| 6,108,937 A | | 8/2000 | Raaijmakers ................ | 34/433 |
| 6,110,290 A | * | 8/2000 | Maeda ....................... | 118/725 |
| 6,320,238 B1 | | 11/2001 | Kizilyalli et al. | |
| 6,479,403 B1 | | 11/2002 | Tsei et al. | |
| 2002/0170498 A1 | * | 11/2002 | Paik ........................... | 118/728 |
| 2004/0060518 A1 | * | 4/2004 | Nakamura et al. .......... | 118/724 |
| 2004/0069227 A1 | * | 4/2004 | Ku et al. .................... | 118/721 |
| 2004/0137397 A1 | * | 7/2004 | Cox ........................... | 432/253 |
| 2004/0229477 A1 | * | 11/2004 | Daniel et al. ............... | 438/795 |

FOREIGN PATENT DOCUMENTS

| KR | 1020010108659 | 12/2000 |
|---|---|---|
| KR | 01108659 | 12/2001 |

OTHER PUBLICATIONS

English language abstract of Korean Publication No. 01108659.

English language abstract of Korean Publication No. 1020010108659.

* cited by examiner

*Primary Examiner*—W. David Coleman
(74) *Attorney, Agent, or Firm*—Marger Johnson & McCollom, P.C.

(57) ABSTRACT

Disclosed is a method for forming a multi-layered structure having at least two films on a semiconductor substrate. The substrate is disposed on a thermally conductible stage for supporting the substrate. After the distance between the stage and the substrate is adjusted to a first interval so that the substrate has a first temperature by heat transferred from the stage, a first thin film is formed on the substrate at the first temperature. The distance is then adjusted from the first interval to a second interval so that the substrate reaches a second temperature, and then a second thin film is formed on the first thin film at the second temperature, thereby forming the multi-layered structure on the substrate. The multi-layered structure can be employed for a gate insulation film or the dielectric film of a capacitor.

19 Claims, 4 Drawing Sheets

METHOD FOR FORMING A MULTI-LAYERED STRUCTURE OF A SEMICONDUCTOR DEVICE AND METHODS FOR FORMING A CAPACITOR AND A GATE INSULATION LAYER USING THE MULTI-LAYERED STRUCTURE

CROSS REFERENCE TO RELATED APPLICATIONS

This application claims priority from Korean Patent Application 2003-00030, filed on Jan. 2, 2003, the contents of which are incorporated herein by reference in their entirety for all purposes.

BACKGROUND OF THE INVENTION

1. Field of the Invention

The present invention relates generally to a method for forming a semiconductor device, and more particularly to a method for forming a multi-layered structure using a thermally conductible stage. The present invention also relates to methods for forming a capacitor and a gate insulation film by employing the multi-layered structure.

2. Description of the Related Art

Manufacturing technology for semiconductor devices has been developed which enhances integration density, reliability, response speed, etc. Deposition process are processes use in manufacturing semiconductor devices. Thus, it is especially important to improve the deposition processes so that the integration density of the semiconductor devices can be increased. The deposition processes utilized to form thin films on a semiconductor substrate include a process to form a gate insulation film and another process to form a capacitor dielectric film. Both the gate insulation film and the dielectric film of a capacitor should have high dielectric constants in order to perform at a required design standard. A method for forming a gate insulation film or the dielectric film of a capacitor using a material having a high dielectric constant is disclosed in U.S. Pat. No. 6,066,525 (issued to Liu et al.) and U.S. Pat. No. 6,320,238 (issued to Kizilyalli et al.).

A thin film having a high dielectric constant, which can include a metal oxide, has previously been used to form the gate insulation film or the dielectric film of a capacitor. More recently, the gate insulation film the dielectric film of the capacitor has been formed using a multi-layered structure in which more than two thin films, composed of metal oxides, are included. For example, U.S. Pat. No. 6,479,403 (issued to Tsei et al.) provides a multi-layered structure including two thin films.

Figure 1:
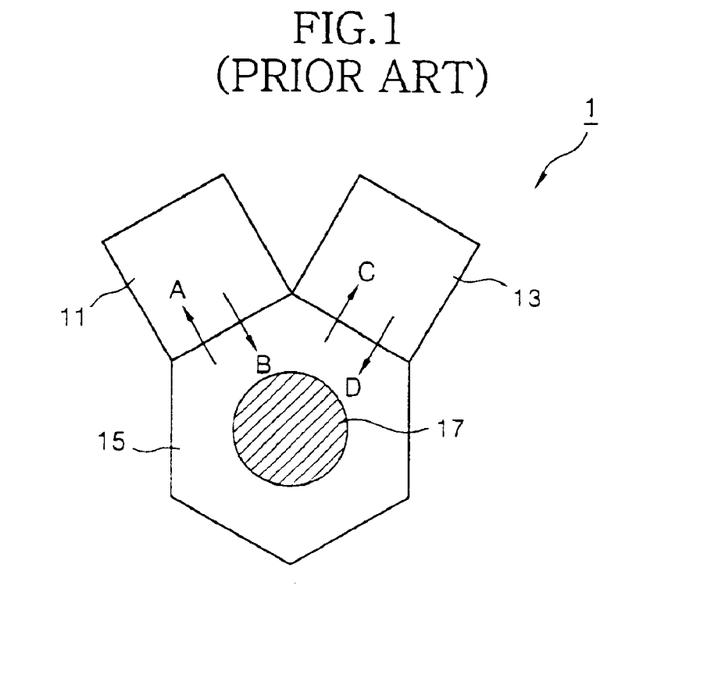
FIG. 1 is a schematic plan view illustrating a conventional deposition apparatus for forming the multi-layered structure of a semiconductor device.

FIG. 1 is a schematic plan view illustrating a conventional deposition apparatus for forming the multi-layered structure of a semiconductor device.

Referring to FIG. 1, a deposition apparatus 1 includes a first and second chamber 11 and 13 that are separated from each other. The deposition apparatus 1 further includes a transfer chamber 15 for transferring a semiconductor substrate 17 between the first and second chambers 11 and 13. Therefore, the transfer chamber 15 connects the first chamber 11 to the second chamber 13. A multi-layered structure including two thin films is formed on the semiconductor substrate 17 using the deposition apparatus 1. For example, the multi-layered structure including an aluminum oxide ($Al_2O_3$) thin film and a titanium oxide ($TiO_2$) thin film can be formed on the semiconductor substrate 17 with the deposition apparatus 1.

Now, a method for forming the multi-layered structure on the semiconductor substrate using the deposition apparatus 1 will be described.

The semiconductor substrate 17 is loaded into the first chamber 11 from the transfer chamber 15 along the direction of A. An aluminum oxide thin film is formed on the semiconductor substrate 17 in the first chamber 11. The aluminum oxide thin film is formed on the semiconductor substrate 17 at a temperature of about 450° C. for about 400 second.

After the aluminum oxide thin film is formed on the semiconductor substrate 17, the semiconductor substrate 17 is transferred from the first chamber 11 to the transfer chamber 15 along the direction B. Then, the semiconductor substrate 17 is loaded into the second chamber 13 from the transfer chamber 15 in the direction C. A titanium oxide thin film is formed on the aluminum oxide thin film in the second chamber 13. In this case, the titanium oxide thin film is formed at a temperature of about 350° C. for about 200 seconds. After the titanium oxide thin film is formed on the aluminum oxide thin film, the semiconductor substrate 17 including the thin films is transferred from the second chamber 13 to the transfer chamber 15 in the direction of D. Thus, the multi-layered structure including the aluminum oxide and titanium oxide thin films is formed on the semiconductor substrate 17.

As described above, the gate insulation film or the dielectric film of the capacitor including the above-mentioned multi-layered structure, in which two thin films having different deposition characteristics are included, is formed on the semiconductor substrate from two separated chambers without vacuum break during the formations of the thin films. However, the productivity and the operation efficiency of the deposition apparatus may be low because two thins films are independently formed in the separated chambers. Namely, the second chamber 13 is empty for more than 200 second while the aluminum oxide thin film is formed in the first chamber. This is because the aluminum oxide thin film is formed in the first chamber 11 for about 400 second while the formation of the titanium oxide thin film in the second chamber 13 takes only about 200 second. Thus, the above-described process lowers the productivity and the operation efficiency of the deposition apparatus. Particularly, the productivity and the operation efficiency of the deposition apparatus may be seriously decreased during the formations of the thin films when there are significant time differences between the formations of the thin films. In addition, the aluminum oxide thin film is formed at a temperature of about 450° C. while the titanium oxide thin film is formed at a temperature of about 350° C. Therefore, it may be difficult to further reduce the productivity of the deposition apparatus if the temperature of the semiconductor substrate cannot be rapidly changed during the formations of the two thin films. At best with the conventional deposition apparatus, the temperature of the semiconductor substrate is merely changed by several centigrade degrees per minute. Thus, the large variation in temperature of the film forming processes requires even more wasted time, again lowering the efficiency of production. Additionally, contaminants such as particles in the transfer chamber may be absorbed on the semiconductor substrate because the semiconductor substrate must be frequently transferred from one chamber to another chamber during the formation of the multi-layered structure.

Nowadays, a method has been developed for forming a first thin film and a second thin film on a semiconductor substrate in-situ in one chamber. That is, the first and second thin films are formed at different temperatures in accordance with the variation of the temperature of a heating member like a heater that heats a semiconductor substrate. However, the variation rate of the temperature of the semiconductor substrate is merely changed by several centigrade per minute (° C./min) when the semiconductor substrate is heated using the heating member. As a result, there is still wasted time for the varying the temperature of the semiconductor substrate between film formations that requires several minutes when the temperature of the semiconductor substrate must be changed by a relatively large amount.

Figure 2:
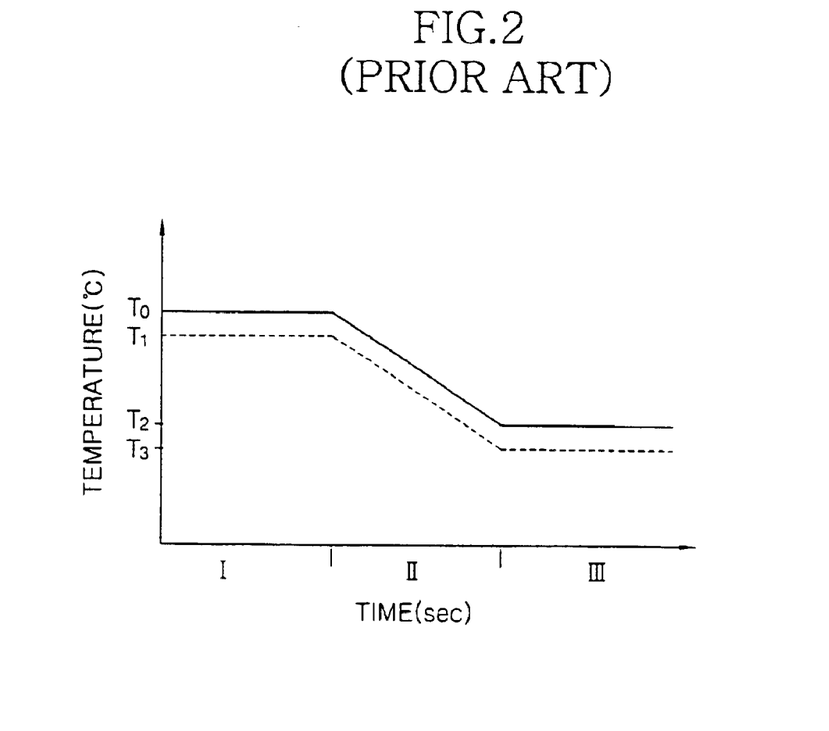
FIG. 2 is a graph showing the variation of the temperature of a substrate during the formation of the multi-layered structure with a conventional heating member.

FIG. 2 is a graph showing the variation of the temperature of a substrate during the formation of the multi-layered structure with a conventional heating member. In FIG. 2, the solid line represents the temperature of a heating member, and a phantom (dashed) line indicates the temperature of a semiconductor substrate. A first thin film is formed on the semiconductor substrate for a first time interval I, then the temperature of the semiconductor substrate is changed for a second time interval II, and a second thin film is formed on the first thin film for a third time interval III.

Referring to FIG. 2, the temperature of the semiconductor substrate characteristically depends on the temperature of the heating member. The temperature of the semiconductor substrate is changed from a first temperature $T_1$ to a second temperature $T_3$ according to the variation of the temperature of the heating member from $T_0$ to $T_2$. As a result, the variation in temperature of the semiconductor substrate may demand a significant amount of time when the temperature of the semiconductor substrate is changed using a heating member. Again, the productivity of the deposition apparatus may be deteriorated when the thin films of the multi-layered structure are formed at different temperatures because the time necessary to vary the temperature of the semiconductor substrate can be large.

SUMMARY OF THE INVENTION

In order to overcome the above-mentioned problems, it is one feature of the present invention to provide a method for forming a multi-layered structure including at least two thin films on a semiconductor substrate in accordance with a rapid variation in the temperature of the semiconductor substrate in one chamber.

It is another feature of the present invention to provide a method for forming a dielectric film having at least two thin films including metal oxides on the bottom electrode of a capacitor by rapidly changing the temperature of a semiconductor substrate in one chamber.

It is still another feature of the present invention to provide a method for forming a gate insulation film having at least two thin films including metal oxides on a semiconductor substrate by rapidly varying the temperature of the semiconductor substrate in one chamber.

In accordance with one aspect of the present invention, a method for forming a multi-layered structure of a semiconductor device is provided. According to this method for forming the multi-layered structure, a substrate is positioned on a thermally conductive stage for supporting a substrate. After the distance between the stage and the substrate is adjusted to a first interval, such that the substrate has a first temperature by heat transfer from the stage, a first thin film is formed on the substrate at the first temperature. The distance between the stage and the substrate is then adjusted from the first interval to a second interval such that the substrate reaches a second temperature by heat transfer from the stage. At this point, a second thin film is formed on the first thin film at the second temperature. In this process, the first interval and/or the second interval are preferably adjusted by moving lift pins when the stage is fixed, by moving the stage when the lift pins are fixed, or by cooperatively moving the stage and the lift pins.

In accordance with another aspect of the present invention, a method for forming a capacitor of a semiconductor device is provided. In this method for forming the capacitor, a bottom electrode is formed on a substrate, and the substrate is disposed on a thermally conductive stage for supporting the substrate. After the distance between the stage and the substrate is adjusted to a first interval, such that the substrate has a first temperature by heat transfer from the stage, a first thin film including a first metal oxide is formed on the substrate at the first temperature. Subsequently, the distance between the stage and the substrate is adjusted from the first interval to a second interval so that the substrate reaches a second temperature by heat transfer from the stage. A second thin film including a second metal oxide is then formed on the first thin film at the second temperature to provide a dielectric film including the first and the second thin films on the bottom electrode. Finally, a top electrode is formed on the dielectric film. Here, the first and second metal oxides can include, for example, one selected from the group consisting of aluminum oxide, titanium oxide, hafnium oxide, zirconium oxide, yttrium oxide, tantalum oxide, strontium titanate, barium titanate, barium strontium titanate, and lead zirconium titanate.

In accordance with still another aspect of the present invention, a method for forming a gate insulation film of a semiconductor device is provided. According to this method for forming the gate insulation film, a substrate is disposed on a thermally conductive stage for supporting the substrate. The distance between the stage and the substrate is adjusted to a first interval so that the substrate reaches a first temperature by heat transfer from the stage. A first thin film including a first metal oxide is then formed on the substrate at a first temperature. After the distance between the stage and the substrate is adjusted from the first interval to a second interval so that the substrate reaches a second temperature by heat transfer from the stage, a second thin film including a second metal oxide is formed on the first thin film at the second temperature.

According to an embodiment of the present invention, the temperature of the semiconductor substrate can be varied in accordance with the adjustment of the distance between the semiconductor substrate and the thermally conductive stage. Hence, different thin films can be formed in-situ on the semiconductor substrate at different temperatures in one chamber by a rapid temperature change of the semiconductor substrate. In particular, the present invention can advantageously be employed for forming thin films using an atomic layer deposition (ALD) process or a chemical vapor deposition (CVD) process, which are both sensitive to temperature but relatively insensitive to pressure. Therefore, the productivity and the operation efficiency of a deposition apparatus can be improved because the multi-layered structure including two or more thin films can be formed in-situ in one chamber. In addition, contaminants may not be absorbed on the semiconductor substrate during the formation of the multi-layered structure because the multi-layered structure is formed on the semiconductor substrate without transferring the semiconductor substrate between chambers.

BRIEF DESCRIPTION OF THE DRAWINGS

The above and other advantages of the present invention will become more apparent by describing in detail embodiments of the present invention with reference to the accompanying drawings, in which.

DETAILED DESCRIPTION OF THE INVENTION

Hereinafter, the embodiments of the present invention will be described in detail with reference to the accompanying drawings. In the drawings, like reference numerals identify similar or identical elements.

Figure 3:
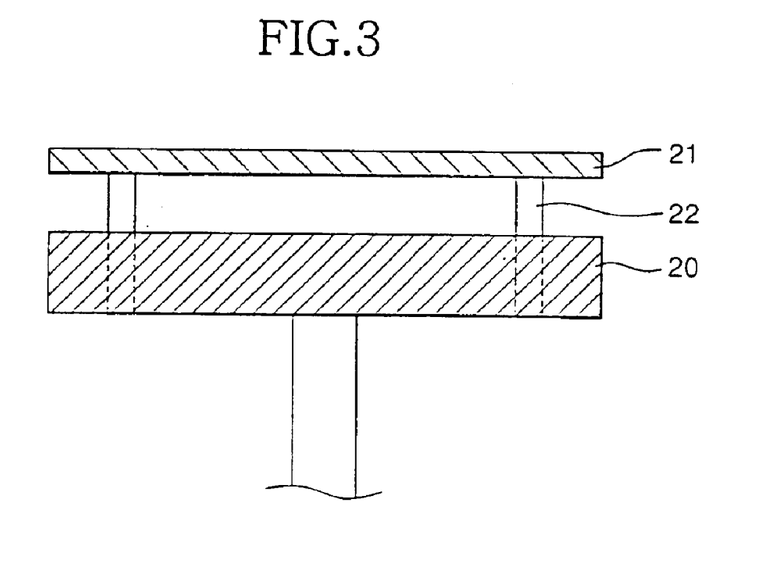
FIG. 3 is a schematic cross-sectional view illustrating the stage of a deposition apparatus for forming the multi-layered structure of a semiconductor device according to an embodiment of the present invention.
Figure 4:
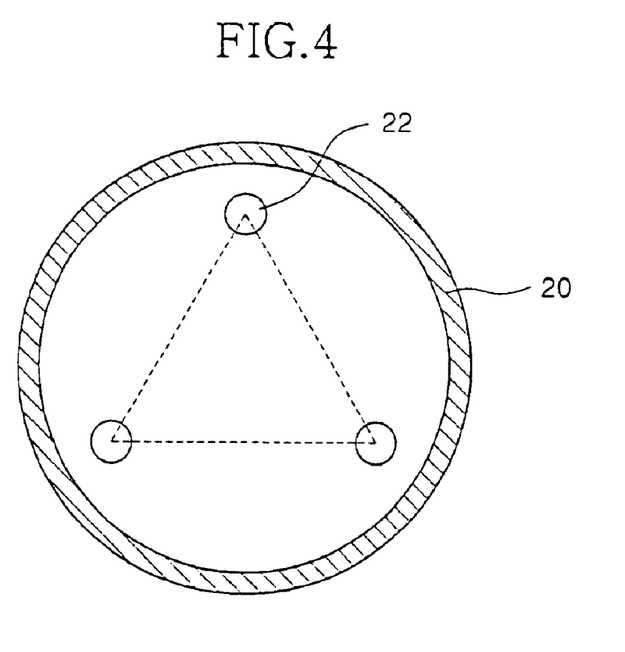
FIG. 4 is a plan view illustrating lift pins installed on the stage in FIG. 3 according to an embodiment of the present invention.

FIG. 3 is a schematic cross-sectional view illustrating the stage of a deposition apparatus for forming the multi-layered structure of a semiconductor device according to an embodiment of the present invention, and FIG. 4 is a plan view illustrating lift pins installed on the stage in FIG. 3.

Referring to FIG. 3, a stage 20 is provided to receive a semiconductor substrate 21 positioned thereon. The stage 20 is installed in the chamber of a deposition apparatus. The stage 20 can include a heater block for accelerating heat transfer to the substrate 21. When the semiconductor substrate 21 is positioned on the stage 20, the stage 20 provides the semiconductor substrate 21 with adequate heat to form thin films thereon through a heat transfer mechanism.

The stage 20 also includes lift pins 22 for supporting the semiconductor substrate 21. That is, the semiconductor substrate 21 can be supported using the lift pins 22 when the semiconductor substrate 21 is disposed on the stage 20. Particularly, the stage 20 preferably includes three lift pins 22 in order to support the semiconductor substrate 21 in a stable manner, as shown in FIG. 4. More preferably, the three lift pins 22 are arranged in a triangular shape.

Figure 5A:
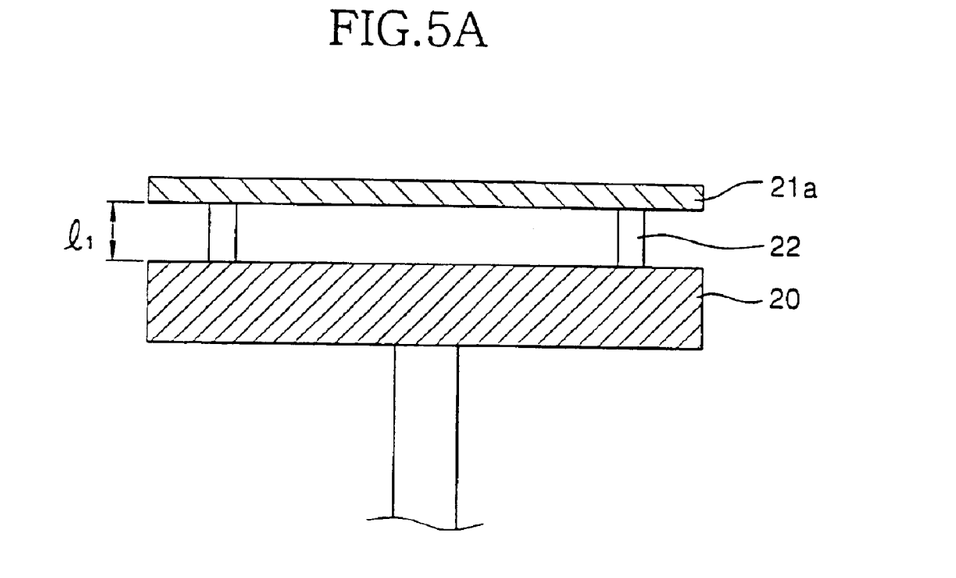
FIGS. 5A and 5B are schematic cross-sectional views of the stage illustrating the method for forming the multi-layered structure of the semiconductor device according to this embodiment of the present invention.
Figure 5B:
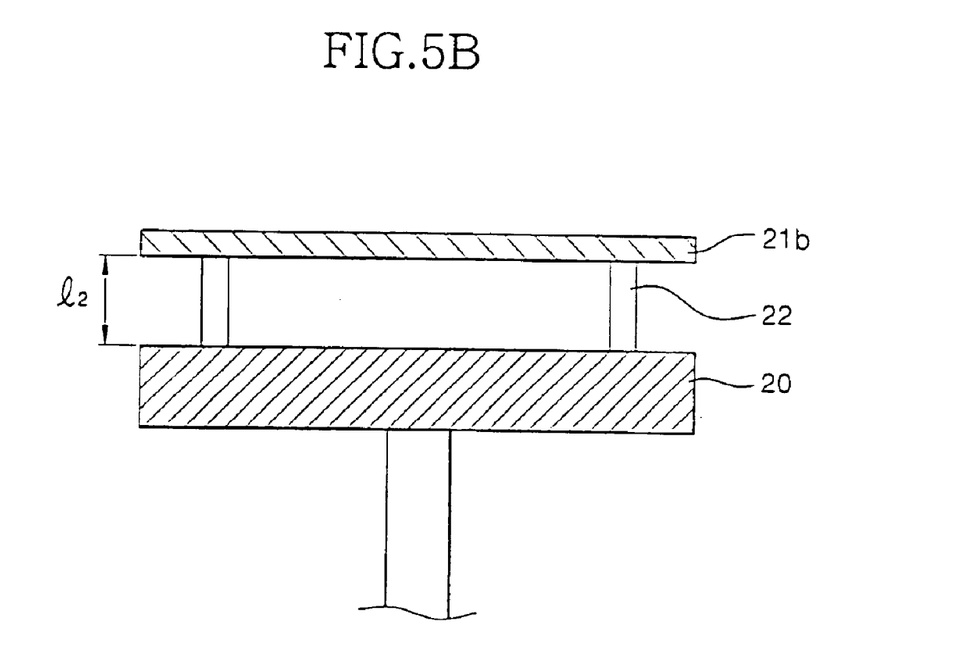

FIGS. 5A and 5B are schematic cross-sectional views of the stage illustrating the method for forming the multi-layered structure of the semiconductor device according to this embodiment of the present invention.

Referring to FIGS. 5A and 5B, the semiconductor substrate 21 is disposed on the stage 20 to form a multi-layered structure including at least two thins films while the lift pins 22 support the semiconductor substrate 21a.

The chamber of the apparatus where the semiconductor substrate 21a positioned therein is heated such that the semiconductor substrate 21a reaches a first temperature. As shown in FIG. 5A, the distance between the stage 20 and the semiconductor substrate 21 is adjusted to a first interval l1, which helps the semiconductor substrate 21a reach the first temperature. That is, adjusting the distance between the stage 20 and the semiconductor substrate 21a can control the temperature of the semiconductor substrate 21a. In this case, the first interval e 1 between the stage 20 and the semiconductor substrate 21a can be achieved by the operation of the lift pins 22. Namely, the lift pins 22 can move vertically upward or downward to adjust the distance between the stage 20 and the semiconductor substrate 21a while the stage 20 is fixed in the chamber. As a result, the first interval l1 is provided between the stage 20 and the semiconductor substrate 21a such that the semiconductor substrate 21a can reach the first temperature.

However, another embodiment of the present invention provides that the stage 20 itself can be moved and positioned to ensure the first interval l1 between the stage 20 and the semiconductor substrate 21a is met without moving the lift pins 22. That is, the stage 20 on which the semiconductor substrate 21a is disposed can move vertically in an upward or a downward direction while the lift pins 22 are fixed to the stage 20, such that the first interval l1 is provided between the stage 20 and the semiconductor substrate 21a having the first temperature.

Additionally, the first interval l1 between the stage 20 and the semiconductor substrate 21a can be achieved by the moving both the stage 20 and the lift pins 22. Namely, the stage 20 and the lift pins 22 can independently or together operate to provide the first interval f 1 between the stage 20 and the semiconductor substrate 21a.

For example, motions of the lift pins are disclosed in Korean Laid Open Patent Publication No. 2001-108659. In the above Korean Laid Open Patent Publication, the temperature of a semiconductor substrate is varied according to the adjustment of the heights of the lift pins that support the semiconductor substrate. However, the above-mentioned Korean Laid Open Patent Publication discloses the method for thermally treating the semiconductor substrate only, and does not refer to the deposition of thin films on the semiconductor substrate. Also, the above-mentioned patent teaches to operate the lift pins to adjust the distance between the semiconductor substrate and a stage, but is silent on independently operating the stage and the lift pins to control the interval between the semiconductor substrate and the stage, which the present invention does.

Referring now FIG. 5A, a first thin film is formed on the semiconductor substrate 21a having a first temperature. The first thin film can be formed using an atomic layer deposition (ALD) process or a chemical vapor deposition (CVD) process. The first thin film can include a first metal oxide having, for example, aluminum oxide ($Al_2O_3$), titanium oxide ($T_1O_2$), hafnium oxide ($HfO_2$), zirconium oxide ($ZrO_2$), yttrium oxide ($Y_2O_3$), tantalum oxide ($Ta_2O_5$), strontium titanate ($SrTiO_3$), barium titanate ($BaTiO_3$), barium strontium titanate (($Ba, Sr)TiO_3$), or lead zirconium titanate (($Pb, Zr)TiO_3$). In addition, the first thin film can include compounds having at least two of the above-mentioned metal oxides.

According to the ALD process for forming the first thin film, a first source material for the formation of the first thin film is introduced onto the semiconductor substrate 21a having the first temperature. Some portions of the first source material are chemically absorbed (referred to as chemisorbed) on the semiconductor substrate 21a. When the first thin film includes aluminum oxide, the first source material can include trimethyl aluminum (TMA; $Al(CH_3)_4$). Other portions of the first source material that are not chemically absorbed on the semiconductor substrate 21a are removed from the semiconductor substrate 21a. At this time, an inert gas including, for example, a nitrogen ($N_2$) gas or an argon (Ar) gas can be employed in order to remove the first source material from the chamber.

The chamber where the semiconductor substrate 21a is disposed is also vacuumized through a vacuum pumping process while the first source material is chemically absorbed on the semiconductor substrate 21a. Second source material for the formation of the first thin film is introduced onto the semiconductor substrate 21a such that portions of the second source material are chemically absorbed on the semiconductor substrate 21a. When the first thin film includes, for example, aluminum oxide, the first source material can include, for example, ozone ($O_3$). Other portions of the second source material that are not chemically absorbed on the semiconductor substrate 21a are removed from the semiconductor substrate 21a. In this case, an inert gas including, for example, a nitrogen ($N_2$) gas or an argon (Ar) gas can be employed to remove the second source material from the chamber.

The remaining residues on and around the semiconductor substrate 21a are removed with the first and second source materials, thereby providing a portion of the first thin film on the semiconductor substrate 21a by an atomic layer unit. When the ALD process is repeatedly executed with the semiconductor substrate 21a, the first thin film is completely formed on the semiconductor substrate 21a. Additionally, the semiconductor substrate 21a can undergo a post treatment process after the first thin film is formed thereon. In the post treatment process for the semiconductor substrate 21a, a radio frequency plasma can be employed in order to prevent impurities from remaining in or on the first thin film formed on the semiconductor substrate 21a.

Meanwhile, according to a CVD process for the formation of the first thin film on the semiconductor substrate 21a, a reaction gas for the first thin film is introduced onto the semiconductor substrate 21a having a first temperature. After the reaction gas is converted into a plasma, the plasma of the reaction gas reacts on the semiconductor substrate 21a. As a result, the first thin film is formed on the semiconductor substrate 21a in accordance with the reaction between the plasma and the semiconductor substrate 21a. When the first thin film includes, for example, aluminum oxide, the reaction gas can include a mixture of TMA and ozone.

As described above, the first thin film can be formed on the semiconductor substrate 21a employing either the ALD or the CVD process. In both of these processes, the temperature conditions required for the formation of the first thin film can be achieved by adjusting the distance between the stage 20 and the semiconductor substrate 21a. After the first thin film is formed on the semiconductor substrate 21a, the distance between the stage 20 and the semiconductor substrate 21a is changed from the first interval e 1 to a second interval l2 as shown FIG. 5B. The second interval l2 between the stage 20 and the semiconductor substrate 21a can be achieved in accordance with the motions of the lift pins 22, the operation of the stage 20, or the independent operations of the lift pins 22 and the stage 20, as described above. When the distance between the stage 20 and the semiconductor substrate 21a is changed to the second interval l2, the semiconductor substrate 21a including the first thin film reaches a second temperature.

A second thin film is formed on the semiconductor substrate 21a while the semiconductor substrate 21a remains at the second temperature. The second thin film can be formed using a process similar to that of the first thin film, for example, an ALD process or a CVD process. The second thin film preferably includes a second metal oxide, such as aluminum oxide, titanium oxide, hafnium oxide, zirconium oxide, yttrium oxide, tantalum oxide, strontium titanate, barium titanate, barium strontium titanate, or lead zirconium titanate. Also, the second thin film can include compounds having at least two of the above-mentioned oxides. When the second thin film includes titanium oxide formed by an ALD process, a first source material for the formation of the second thin film can include titanium tetraisopropoxide (TTIP; $Ti(OC_3H_7)_4$), and a second source material for the second thin film can include ozone ($O_3$). On the other hand, a reaction gas can include a mixture of a TTIP gas and an ozone gas when the second thin film includes titanium oxide formed by a CVD process.

According to the present embodiment, a multi-layered structure including a first and second thin films can be formed in-situ on a semiconductor substrate using one stage installed in one chamber. Particularly, when the distance between the stage and the semiconductor substrate is adjusted from the second interval to a third interval or a fourth interval, a third thin film or a fourth thin film can be formed in-situ on the semiconductor substrate without further changes to the stage or the chamber.

As described above, the temperature of the semiconductor substrate can be controlled in accordance with adjustments in the distance interval between the semiconductor substrate and the thermally conductive stage. That is, the temperature of the semiconductor substrate increases as the interval between the semiconductor substrate and the stage decreases while the temperature of the semiconductor substrate decreases as the interval between the semiconductor substrate and the stage increases.

Figure 6:
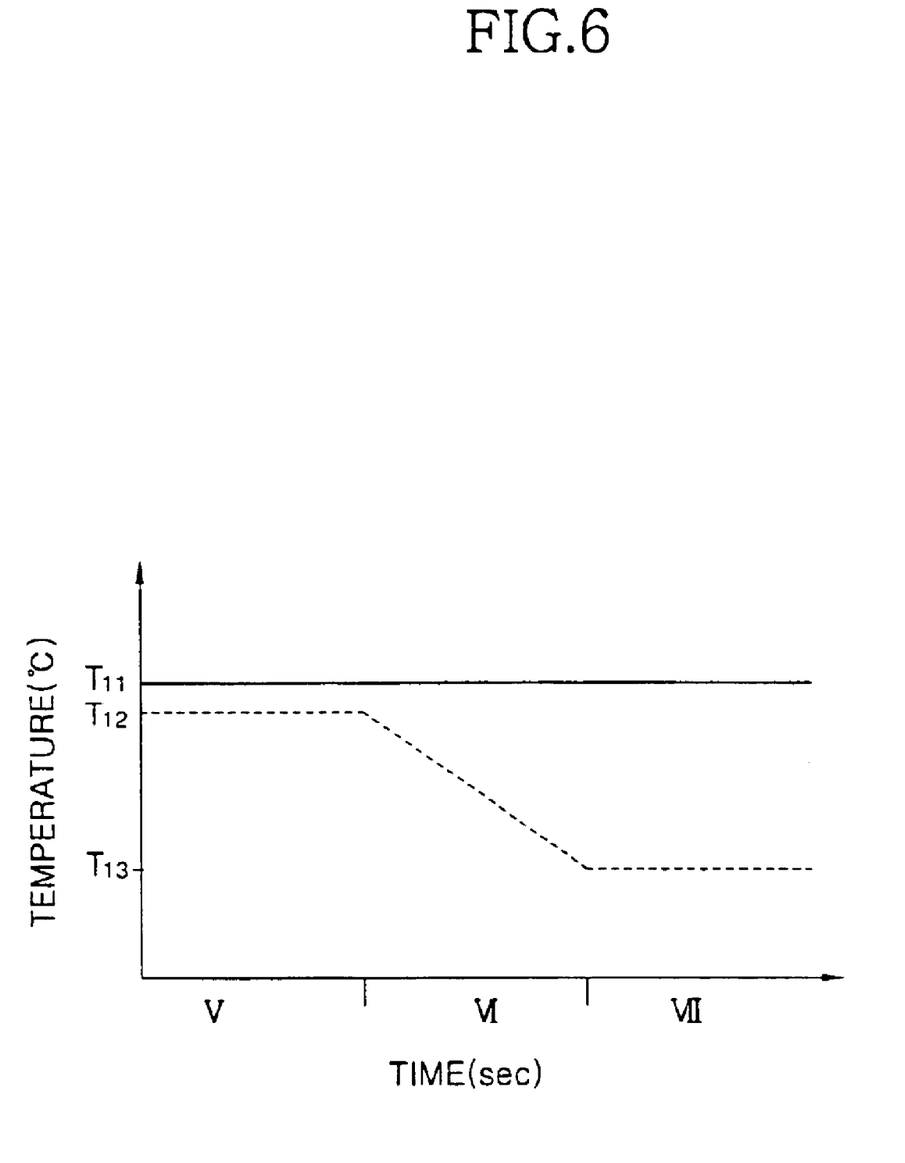
FIG. 6 is a graph showing the variation of the temperature of a substrate during the formation of a multi-layered structure according to the present invention.

FIG. 6 is a graph showing the variation of the temperature of a substrate during the formation of a multi-layered structure according to the present invention. In FIG. 6, the solid line represents the temperature of a stage and the phantom (dashed) line indicates the temperature of a semiconductor substrate in accordance with the heat transferred from the stage. A first thin film is formed during a first time interval V, a distance between the stage and the semiconductor substrate is adjusted from a first interval to a second interval during a second time interval VI, and a second film is formed during a third time interval VII.

Referring to FIG. 6, the temperature of the stage is constantly maintained at temperature T11 while the temperature of the semiconductor substrate is varied from a first temperature T12 to a second temperature T13 in accordance with the adjustment of the distance interval between the stage and the semiconductor substrate. For example, when the distance between the stage and the semiconductor substrate is at a first interval l1, the semiconductor substrate is at the first temperature T12. Similarly, the semiconductor substrate is at the second temperature T13 when the distance between the stage and the semiconductor substrate is changed to a second interval l2. Furthermore, the desired temperature of the semiconductor substrate can be rapidly achieved by adjusting the distance between the stage and the semiconductor substrate. Accordingly, a multi-layered structure including at least a first thin film and a second thin film can be very rapidly formed on the semiconductor substrate. Namely, the time required for forming the multi-layered structure can be greatly reduced. Therefore, the method of the present invention for forming a multi-layered structure can be advantageously employed for a gage insulation film and the dielectric film of a capacitor having a high dielectric constant.

According to another embodiment of the present invention, a method for forming a gate insulation film employing the multi-layered structure will now be described in detail.

A semiconductor substrate is disposed on the stage installed in a chamber of a deposition apparatus in order to form the gate insulation film. The lift pins of the stage support the semiconductor substrate. The distance between the stage and the semiconductor substrate is adjusted to a first interval. The distance between the stage and the semiconductor substrate can be controlled by vertically moving the lift pins upward or downward while the stage is fixed or by moving the stage vertically in respect to fixed lift pins. Also, the distance between the stage and the semiconductor substrate can be adjusted in accordance with the cooperative operations of the stage and the lift pins. In any case, the semiconductor substrate reaches a first temperature when the first interval is obtained between the stage and the semiconductor substrate.

A first thin film, including a first metal oxide, is formed on the semiconductor substrate having the first temperature. The first thin film can be formed using an ALD process or a CVD process at the first temperature. Examples of the first metal oxide include aluminum oxide, titanium oxide, hafnium oxide, zirconium oxide, yttrium oxide, tantalum oxide, strontium titanate, barium titanate, barium strontium titanate, lead zirconium titanate, etc.

After the first thin film is formed on the semiconductor substrate, the distance between the stage and the semiconductor substrate is adjusted to a second interval. As described above, the distance between the stage and the semiconductor substrate can be controlled by the motions of the lift pins while the stage is fixed, by the operation of the stage when the lift pins are fixed, or by the cooperative operations of the stage and the lift pins. The semiconductor substrate reaches a second temperature when the distance interval between the stage and the semiconductor substrate is obtained.

A second thin film including a second metal oxide is formed on the first thin film of the semiconductor substrate at the second temperature. The second thin film can be formed as well using an ALD or a CVD process. The second metal oxide includes, for example, aluminum oxide, titanium oxide, hafnium oxide, zirconium oxide, yttrium oxide, tantalum oxide, strontium titanate, barium titanate, barium strontium titanate, lead zirconium titanate, etc. Thus, the gate insulation film, including the first and second thin films, is formed on the semiconductor substrate. In this embodiment, the gate insulation film having a multi-layered structure can be formed in-situ on the semiconductor substrate in accordance with the deposition method performed using one stage and one chamber. Additionally, the temperature of the semiconductor substrate can be rapidly adjusted as required for the formation of the first and second thin films. Hence, the time required for the formation of the gate insulation film can be greatly reduced and the operation efficiency of the deposition apparatus can be improved because only one stage and one chamber are used for the formation of the gate insulation film.

According to still another embodiment of the present invention, a method for forming the dielectric film of a capacitor will now be described in detail.

A semiconductor substrate where a bottom electrode of a capacitor is provided is positioned on the stage installed in a chamber of a deposition apparatus. The lift pins of the stage support the semiconductor substrate. The distance between the stage and the semiconductor substrate is adjusted to a first interval. In this case, the distance between the stage and the semiconductor substrate can be controlled by moving the lift pins while the stage is fixed, by operating the stage when the lift pins are fixed, or by cooperatively operating the stage and the lift pins.

A first thin film, including a first metal oxides is formed on the bottom electrode of the capacitor positioned on the semiconductor substrate having a first temperature. The first thin film can be formed using, for example, an ALD or a CVD process at the first temperature. The first metal oxide includes, for example, aluminum oxide, titanium oxide, hafnium oxide, zirconium oxide, yttrium oxide, tantalum oxide, strontium titanate, barium titanate, barium strontium titanate, lead zirconium titanate, etc.

After the first thin film is formed on the bottom electrode of the capacitor, the distance between the stage and the semiconductor substrate is adjusted to a second interval. The distance between the stage and the semiconductor substrate can be controlled in accordance with any of the above-described processes.

A second thin film, including a second metal oxide, is then formed on the first thin film while the semiconductor substrate maintains a second temperature. The second thin film is formed using, for example, an ALD or a CVD process at the second temperature. The second metal oxide includes, for example, aluminum oxide, titanium oxide, hafnium oxide, zirconium oxide, yttrium oxide, tantalum oxide, strontium titanate, barium titanate, barium strontium titanate, lead zirconium titanate, etc. Thus, the dielectric film of the capacitor, including first and second thin films, is formed on the bottom electrode of the capacitor. As described above, the dielectric film of the capacitor having a multi-layered structure can be formed in-situ in accordance with the deposition method performed using one stage and one chamber. Because the temperature of the semiconductor substrate can be rapidly changed to accommodate the formations of the first and second thin films, the time for the formation of the dielectric film of the capacitor can be greatly reduced. This time requirement reduction and the use of only one stage and one chamber for the formation of the dielectric film of the capacitor greatly improve the operational efficiency of the deposition apparatus. When a top electrode is formed on the dielectric film of the resultant structure, the capacitor of a semiconductor device is completed.

A method will now be described for forming a multi-layered structure having a first thin film including aluminum oxide and a second thin film including titanium oxide.

To start with, a semiconductor substrate is positioned on lift pins installed on a stage of a deposition apparatus. The lift pins are moved vertically in an upward or a downward direction to adjust the distance between the stage and the semiconductor substrate to a first interval. When the distance between the stage and the semiconductor substrate is adjusted to this first interval, the semiconductor substrate will reach a temperature of about 450° C. in accordance with transferred heat from the stage.

After the semiconductor substrate has been purged by an argon gas around the semiconductor substrate for about 0.1 second, a TMA gas is directed onto the semiconductor substrate for about 0.2 second, such that portions of the TMA gas are chemically absorbed on the semiconductor substrate. In this case, since other portions of the TMA gas might be physically absorbed on the semiconductor substrate, argon gas must again be introduced for about 1 second into the chamber to remove the unwanted physically absorbed TMA gas from the semiconductor substrate.

A vacuum pumping process is then performed around the semiconductor substrate, and an ozone gas is induced onto the semiconductor substrate for about 2 second. Here, portions of the ozone gas are chemically absorbed on the semiconductor substrate while other portions of the ozone gas are physically absorbed on the semiconductor substrate. Thus, an argon gas is again introduced onto the semiconductor substrate for about 2 second to remove the physically absorbed ozone gas from the semiconductor substrate. Next, a vacuum pumping process is executed around the semiconductor substrate for about 0.5 second. As a result, an aluminum oxide thin film is partially formed on the semiconductor substrate by the atomic layer unit.

When the above-described processes are repeated about fifty-nine times, the aluminum oxide thin film is completely formed on the semiconductor substrate.

After the aluminum oxide film is formed on the semiconductor substrate, the distance between the stage and the semiconductor substrate is adjusted from the first interval to a second interval by, for example, moving the lift pins. When the distance between the stage and the semiconductor substrate has been adjusted to the second interval, the semiconductor substrate reaches a second temperature of about 350° C. In this case, the distance between the stage and the semiconductor substrate can be rapidly changed from the first interval to the second interval, usually within several second.

The semiconductor substrate including the aluminum oxide thin film is again purged by introducing an argon gas around the semiconductor substrate for about 0.1 second. Subsequently, a TTIP gas is induced onto the semiconductor substrate for about 2 second. In this case, portions of the TTIP gas are chemically absorbed on the aluminum oxide thin film formed on the semiconductor substrate while other portions of the TTIP gas are physically absorbed on the aluminum oxide thin film. Accordingly, an argon gas is introduced onto the aluminum oxide thin film on the semiconductor substrate for about 2 second to remove the physically absorbed TTIP gas from the aluminum oxide thin film.

After a vacuum pumping process is executed around the semiconductor substrate for about 0.5 second, an ozone gas is induced onto the aluminum oxide thin film for about 2 second. In this case, portions of the ozone gas are chemically absorbed on the aluminum oxide thin film on the semiconductor substrate while other portions of the ozone gas are physically absorbed on the aluminum oxide thin film. Hence, an argon gas is introduced onto the aluminum oxide thin film on the semiconductor substrate for about 2 second to remove the physically absorbed ozone gas from the aluminum oxide thin film. Then, a vacuum pumping process is executed around the semiconductor substrate for about 0.5 second. As a result, a titanium oxide thin film is partially formed on the aluminum oxide thin film by the atomic layer unit.

When the above-described processes are repeated about fifty-two times, the titanium oxide thin film is completely formed on the aluminum oxide thin film of the semiconductor substrate.

As described above, a multi-layered structure including the aluminum oxide and titanium oxide thin films is formed on the semiconductor substrate. In this case, the temperature of the semiconductor substrate can be rapidly changed to form the titanium oxide thin film after the formation of the aluminum oxide thin film because the temperature of the semiconductor substrate can be varied in accordance with the adjustment of the distance between the stage and the semiconductor substrate. Therefore, the processing time for the formation of the multi-layered structure can be reduced. In addition, the operation efficiency of a deposition apparatus can be enhanced because the processes for forming the multi-layered structure can be formed in-situ using one stage and one chamber. Furthermore, impurities or particles cannot be absorbed on the semiconductor substrate since the semiconductor substrate is not transferred during the formation of the multi-layered structure.

According to the present invention, the temperature of a semiconductor substrate can be rapidly varied in accordance with the adjustment of the distance between a thermally conductive stage and the semiconductor substrate. Different thin films can be formed in-situ on the semiconductor substrate at different temperatures in one chamber by employing the rapid variation of the temperature of the semiconductor substrate. Therefore, the processing time for the formation of a multi-layered structure including different thin films can be reduced and the operation efficiency of a deposition apparatus can be improved. Also, contaminations cannot be absorbed on the semiconductor substrate because the process for the formation of the multi-layered structure can be performed in one chamber without transferring the semiconductor substrate. As a result, the productivity and the reliability of a semiconductor device can be enhanced.

Having described in detail embodiments of the present invention, it is noted that modifications and variations can be made by persons skilled in the art in light of the above teachings. It is therefore to be understood that changes may be made to these particular embodiments of the present invention disclosed which fall within the scope and the spirit of the invention outlined by the appended claims.

What is claimed is:

1. A method for forming a semiconductor device having a multi-layered structure utilizing a thermally conductive stage for supporting a substrate, said method comprising:
   disposing the substrate on the stage;
   adjusting a distance between the stage and the substrate to a first interval so that the substrate has a first temperature by heat transferred from the stage;
   forming a first thin film on the substrate at the first temperature;
   adjusting the distance between the stage and the substrate from the first interval to a second interval so that the substrate has a second temperature by the heat transferred from the stage; and
   forming a second thin film on the first thin film at the second temperature.

2. The method of claim 1, wherein the conductive stage includes lift pins, and wherein the first interval and/or the second interval are adjusted by moving the lift pins when the stage is fixed.

3. The method of claim 1, wherein the conductive stage includes lift pins, and wherein the first interval and/or the second interval are adjusted by moving the stage when the lift pins are fixed.

4. The method of claim 1, wherein the conductive stage includes lift pins, and wherein the first interval and/or the second interval are adjusted by moving the stage and the lift pins cooperatively.

5. The method of claim 1, wherein the first thin film includes a metal oxide.

6. The method of claim 5, wherein the metal oxide includes one selected from the group consisting of aluminum oxide ($Al_2O_3$), titanium oxide ($TiO_2$), hafnium oxide ($HfO_2$), zirconium oxide ($ZrO_2$), yttrium oxide ($Y_2O_3$), tantalum oxide ($Ta_2O_5$), strontium titanate ($SrTiO_3$), barium titanate ($BaTiO_3$), barium strontium titanate ($(Ba, Sr)TiO_3$), and lead zirconium titanate ($(Pb, Zr)TiO_3$).

7. The method of claim 1, wherein the second thin film includes a metal oxide.

8. The method of claim 7, wherein the second metal oxide includes one selected from the group consisting of aluminum oxide, titanium oxide, hafnium oxide, zirconium oxide, yttrium oxide, tantalum oxide, strontium titanate, barium titanate, barium strontium titanate, and lead zirconium titanate.

9. The method of claim 1, wherein the first thin film and the second thin film are formed by an atomic layer deposition process or a chemical vapor deposition process, respectively.

10. The method of claim 1, further comprising:
   adjusting the distance between the stage and the substrate from the second interval to a third interval so that the substrate has a third temperature by heat transferred from the stage; and
   forming a third thin film on the second thin film at the third temperature.

11. The method of claim 10, wherein adjusting the distance and forming a subsequent thin film are performed at least once.

12. A method for forming a capacitor of a semiconductor device comprising:
   forming a bottom electrode on a substrate;
   disposing the substrate on a thermally conductible stage for supporting the substrate;
   adjusting the distance between the stage and the substrate to a first interval so that the substrate has a first temperature by heat transferred from the stage;
   forming a first thin film including a first metal oxide on the substrate at the first temperature;
   adjusting the distance between the stage and the substrate from the first interval to a second interval so that the substrate has a second temperature by the heat transferred from the stage;
   forming a second thin film including a second metal oxide on the first thin film at the second temperature to provide a dielectric film including the first and the second thin films on the bottom electrode; and
   forming a top electrode on the dielectric film.

13. The method of claim 12, wherein the conductive stage includes lift pins, and wherein the first interval and/or the second interval are adjusted by moving the lift pins when the stage is fixed, by moving the stage when the lift pins are fixed, or by moving the stage and the lift pins cooperatively.

14. The method of claim 12, wherein the first and second thin films are formed by an atomic layer deposition process or a chemical vapor deposition process.

15. The method of claim 12, wherein the first and second metal oxides independently include one selected from the group consisting of aluminum oxide, titanium oxide, hafnium oxide, zirconium oxide, yttrium oxide, tantalum oxide, strontium titanate, barium titanate, barium strontium titanate, and lead zirconium titanate.

16. A method for forming a gate insulation film of a semiconductor device comprising:
   disposing a substrate on a thermally conductible stage for supporting the substrate;
   adjusting a distance between the stage and the substrate to a first interval so that the substrate has a first temperature by heat transferred from the stage;
   forming a first thin film including a first metal oxide on the substrate at the first temperature;
   adjusting the distance between the stage and the substrate from the first interval to a second interval so that the substrate has a second temperature by the heat transferred from the stage; and
   forming a second thin film including a second metal oxide on the first thin film at the second temperature.

17. The method of claim 16, wherein the conductive stage includes lift pins, and wherein the first interval and/or the second interval are adjusted by moving the lift pins when the stage is fixed, by moving the stage when the lift pins are fixed, or by cooperatively moving the stage and the lift pins.

18. The method of claim 16, wherein the first and the second thin films are formed by an atomic layer deposition process or a chemical vapor deposition process.

19. The method of claim 16, wherein the first metal oxide and the second metal oxide include one selected from the group consisting of aluminum oxide, titanium oxide, hafnium oxide, zirconium oxide, yttrium oxide, tantalum oxide, strontium titanate, barium titanate, barium strontium titanate, and lead zirconium titanate.

* * * * *

UNITED STATES PATENT AND TRADEMARK OFFICE
CERTIFICATE OF CORRECTION

PATENT NO. : 6,989,338 B2
APPLICATION NO. : 10/737394
DATED : January 24, 2006
INVENTOR(S) : Choi et al.

It is certified that error appears in the above-identified patent and that said Letters Patent is hereby corrected as shown below:

At column 5, line 65, please replace "l1" with --$\ell 1$--
At column 6, line 3, please replace "e 1" with --$\ell 1$--
At column 6, line 8, please replace " l1" with --$\ell 1$--
At column 6, line 14, please replace " l1" with --$\ell 1$--
At column 6, line 19, please replace " l1" with --$\ell 1$--
At column 6, line 22, please replace " l1" with --$\ell 1$--
At column 6, line 27, please replace "f 1" with --$\ell 1$--
At column 7, line 54, please replace "e 1" with --$\ell 1$--
At column 7, line 55, please replace each "12" with --$\ell 2$--
At column 7, line 62, please replace "12" with --$\ell 2$--
At column 8, line 52, please replace " l1" with --$\ell 1$--
At column 8, line 56, please replace "12" with --$\ell 2$--
At column 10, line 7, please replace "oxides" with --oxide--

Signed and Sealed this

Twenty-third Day of January, 2007

JON W. DUDAS
*Director of the United States Patent and Trademark Office*